US011694965B2

(12) United States Patent
Lee et al.

(10) Patent No.: US 11,694,965 B2
(45) Date of Patent: *Jul. 4, 2023

(54) FAN-OUT SEMICONDUCTOR PACKAGE

(71) Applicant: SAMSUNG ELECTRONICS CO., LTD., Suwon-si (KR)

(72) Inventors: Changbo Lee, Suwon-si (KR); Joonseok Oh, Suwon-si (KR); Byunglyul Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 110 days.

This patent is subject to a terminal disclaimer.

(21) Appl. No.: 17/406,517

(22) Filed: Aug. 19, 2021

(65) Prior Publication Data

US 2021/0384136 A1 Dec. 9, 2021

Related U.S. Application Data

(63) Continuation of application No. 16/683,960, filed on Nov. 14, 2019, now Pat. No. 11,121,090.

(30) Foreign Application Priority Data

Dec. 19, 2018 (KR) .................. 10-2018-0165418

(51) Int. Cl.
*H01L 23/538* (2006.01)
*H01L 23/31* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 23/3128; H01L 23/3135; H01L 23/5383; H01L 23/5386;
(Continued)

(56) References Cited

U.S. PATENT DOCUMENTS 11,121,090 B2 * 9/2021 Lee .................. H01L 21/565
2017/0271272 A1 9/2017 Lee et al.
(Continued)

FOREIGN PATENT DOCUMENTS

KR 10-2017-0107318 A 9/2017
KR 10-2018-0032148 A 3/2018
(Continued)

OTHER PUBLICATIONS

Communication dated Aug. 10, 2022 by the Korean Patent Office in Korean Patent Application No. 10-2018-0165418.

*Primary Examiner* — Caleen O Sullivan
(74) *Attorney, Agent, or Firm* — Sughrue Mion, PLLC

(57) ABSTRACT

This invention provides a fan-out semiconductor package, the fan-out semiconductor package includes a frame including one or more insulating layers and having a penetration portion, a semiconductor chip disposed in the penetration portion of the frame and having a connection pad, a connection structure disposed on a lower side of the frame and the semiconductor chip and including a redistribution layer, a first encapsulant covering a back surface of the semiconductor chip and a first region of a top surface of an uppermost insulating layer among the one or more insulating layers of the frame and extending between a sidewall of the penetration portion and a side surface of the semiconductor chip, and a second encapsulant covering a second region of the top surface of the uppermost insulating layer among the
(Continued)

one or more insulating layers of the frame and being in contact with a side surface of the first encapsulant on the frame.

20 Claims, 12 Drawing Sheets

(51) Int. Cl.
  *H01L 23/00* (2006.01)
  *H01L 21/48* (2006.01)
  *H01L 21/56* (2006.01)

(52) U.S. Cl.
  CPC ........ *H01L 21/565* (2013.01); *H01L 23/3128* (2013.01); *H01L 23/3135* (2013.01); *H01L 23/5383* (2013.01); *H01L 23/5386* (2013.01); *H01L 24/19* (2013.01); *H01L 24/20* (2013.01); *H01L 2224/214* (2013.01)

(58) Field of Classification Search
  CPC . H01L 24/19; H01L 21/4853; H01L 21/4857; H01L 21/565; H01L 24/20; H01L 2224/214; H01L 2224/18; H01L 21/561; H01L 23/49827; H01L 23/13; H01L 23/49822; H01L 23/49816; H01L 23/4824; H01L 2224/02379; H01L 2224/02381; H01L 2224/02331
  USPC ....................................................... 257/668
  See application file for complete search history.

(56) References Cited

U.S. PATENT DOCUMENTS

| | | |
|---|---|---|
| 2018/0082933 A1 | 3/2018 | Ko et al. |
| 2018/0130761 A1 | 5/2018 | Kim et al. |
| 2018/0138029 A1 | 5/2018 | Kim et al. |
| 2019/0131242 A1 | 5/2019 | Lee et al. |
| 2019/0206755 A1 | 7/2019 | Choi et al. |
| 2019/0206756 A1 | 7/2019 | Kim et al. |
| 2020/0083176 A1 | 3/2020 | Lim et al. |

FOREIGN PATENT DOCUMENTS

| | | |
|---|---|---|
| KR | 10-2018-0052062 A | 5/2018 |
| KR | 10-2018-0055570 A | 5/2018 |
| KR | 10-2018-0064743 A | 6/2018 |

\* cited by examiner

I – I'

FAN-OUT SEMICONDUCTOR PACKAGE

CROSS-REFERENCE TO RELATED APPLICATION(S)

This is a continuation of U.S. application Ser. No. 16/683,960 filed Nov. 14, 2019, which claims benefit of priority to Korean Patent Application No. 10-2018-0165418 filed on Dec. 19, 2018 in the Korean Intellectual Property Office, the disclosure of which is incorporated herein by reference in its entirety.

TECHNICAL FIELD

The present disclosure relates to a semiconductor package, for example, a fan-out semiconductor package.

BACKGROUND

Recently, a significant trend in the development of technology related to semiconductor chips is to reduce the size of components. Accordingly, in the field of packaging technology, a semiconductor package has been required to have a small size while implementing a plurality of pins in accordance with a rapid increase in demand for small-sized semiconductor chips and the like. There are packaging technologies meeting the above demand. Such a packaging technology is a fan-out semiconductor package. In the fan-out semiconductor package, an electric connection structure is redistributed externally of a region, in which a semiconductor chip is disposed, allowing a semiconductor package to have a small size while implementing a plurality of pins.

Recently, in order to achieve improved electrical characteristics and efficient space use of premium smartphones and to apply a package-on-package (PoP) of a semiconductor package including different semiconductor chips, a backside circuit is required in a semiconductor package structure. In addition, the requirement for a line and a space of a backside circuit has been increased to meet advances in chip characteristics and decreases in chip areas.

SUMMARY

An aspect of the present disclosure is to provide a fan-out semiconductor package structure to which a backside circuit having a fine pitch may be applied in high yield.

According to an aspect of the present disclosure, a fan-out semiconductor package includes a frame including one or more insulating layers and having a penetration portion penetrating through the one or more insulating layers, a semiconductor chip, disposed in the penetration portion of the frame, having a connection pad, a connection structure, disposed on a lower side of the frame and the semiconductor chip, including a redistribution layer electrically connected to the connection pad, a first encapsulant covering a back surface of the semiconductor chip and a first region of a top surface of an uppermost insulating layer among the one or more insulating layers of the frame and extending between a sidewall of the penetration portion and a side surface of the semiconductor chip, and a second encapsulant covering a second region of the top surface of the uppermost insulating layer among the one or more insulating layers of the frame and being in contact with a side surface of the first encapsulant on the frame.

According to an aspect of the present disclosure, a fan-out semiconductor package includes a frame having a penetration portion and having a top surface having a first region, in which a metal layer is disposed, and a second region, surrounding the first region, in which a wiring layer is disposed, a semiconductor chip, disposed in the penetration portion of the frame, having a connection pad, a connection structure, disposed on a lower side of the frame and the semiconductor chip, including a redistribution layer electrically connected to the connection pad, a first encapsulant covering a back surface of the semiconductor chip and the metal layer and filling at least a portion of the penetration portion, and a second encapsulant covering at least a portion of the second region of the top surface of the frame and the wiring layer and extending to cover the first encapsulant. The wiring layer has a thickness greater than a thickness of the metal layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
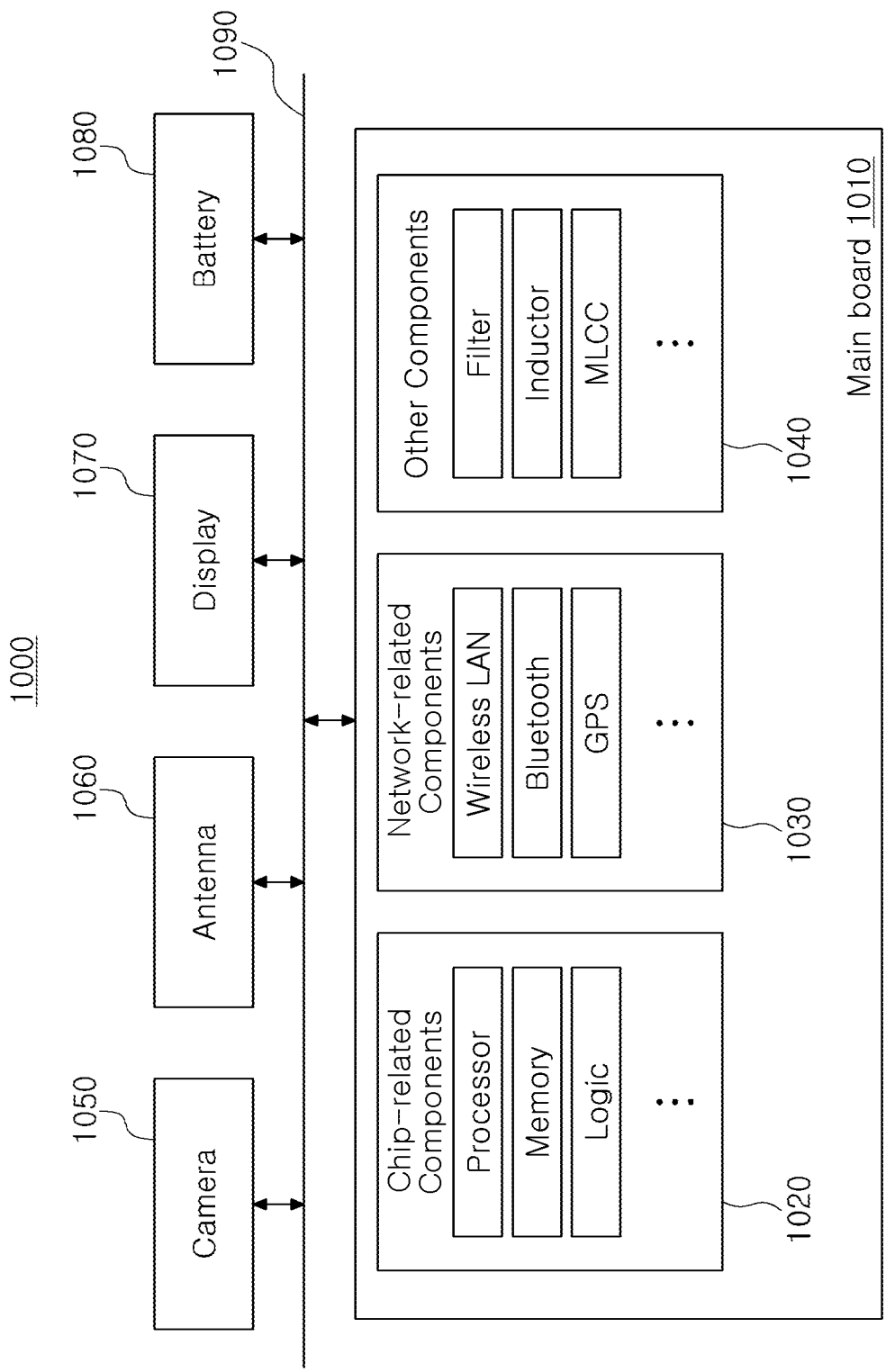
FIG. 1 is a block diagram schematically illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below by various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components implementing a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
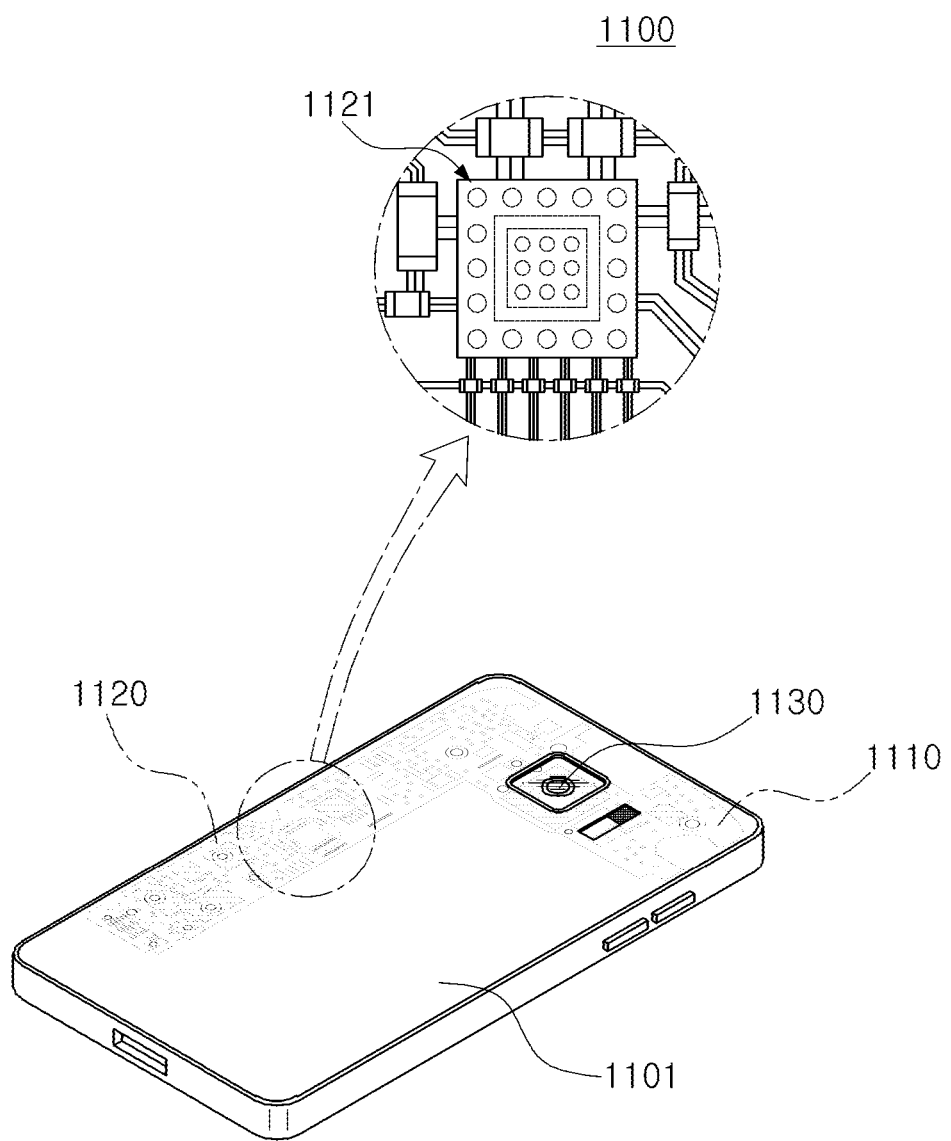
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package and a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
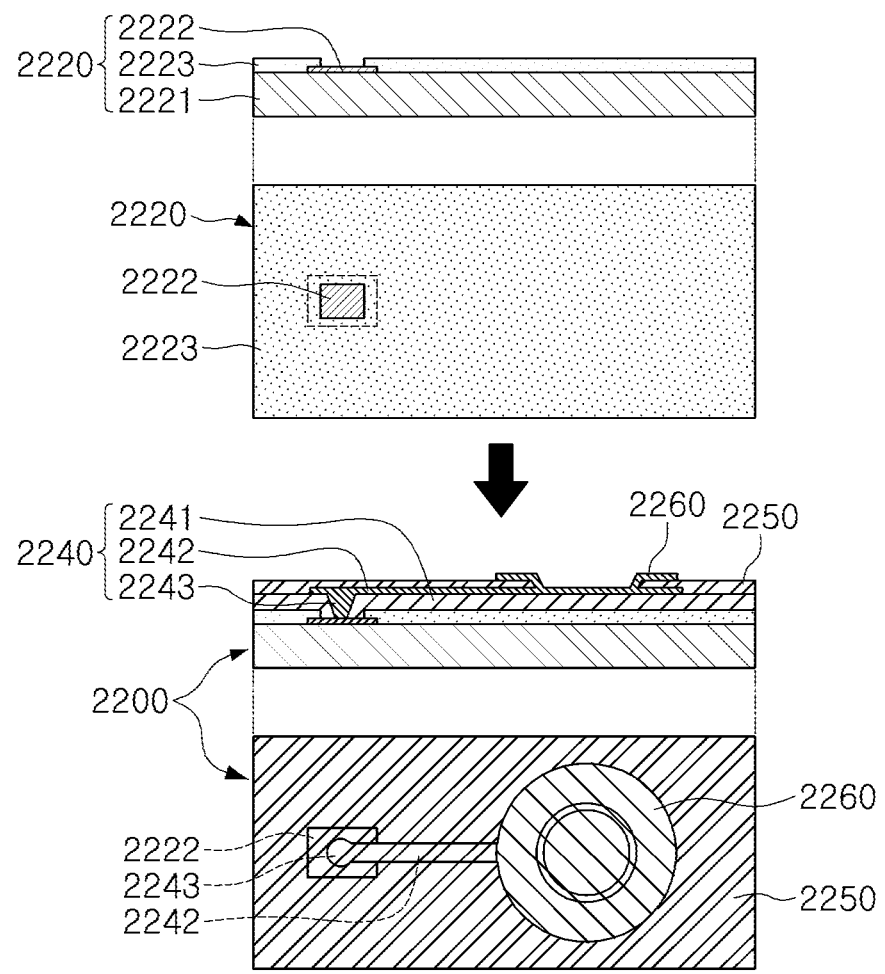
FIGS. 3A and 3B are schematic cross-sectional views illustrating states of a fan-in semiconductor package before and after being packaged.
Figure 3B:
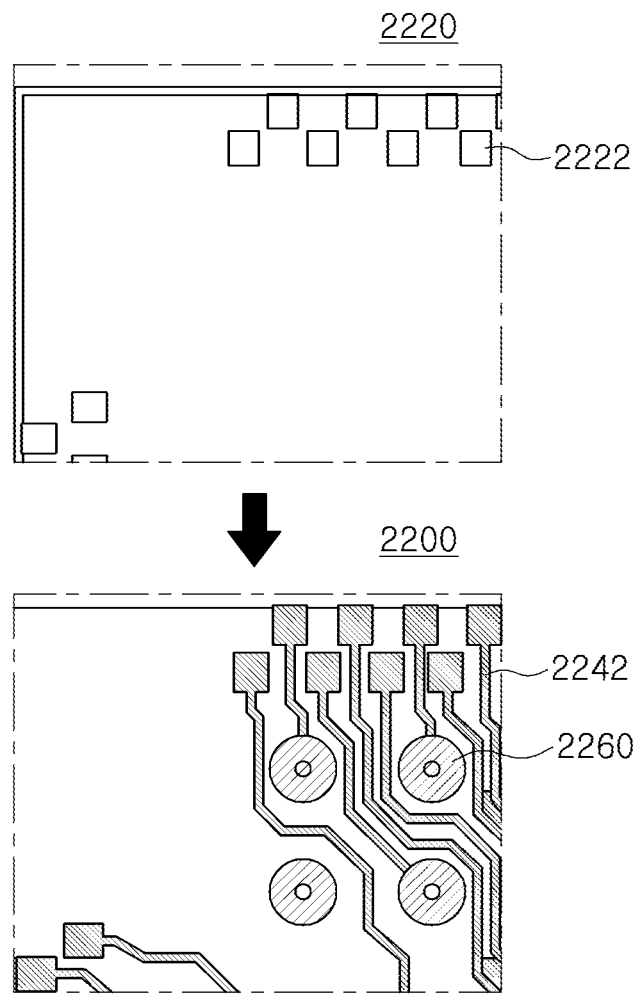

FIGS. 3A and 3B are schematic cross-sectional views illustrating states of a fan-in semiconductor package before and after being packaged.

Figure 4:
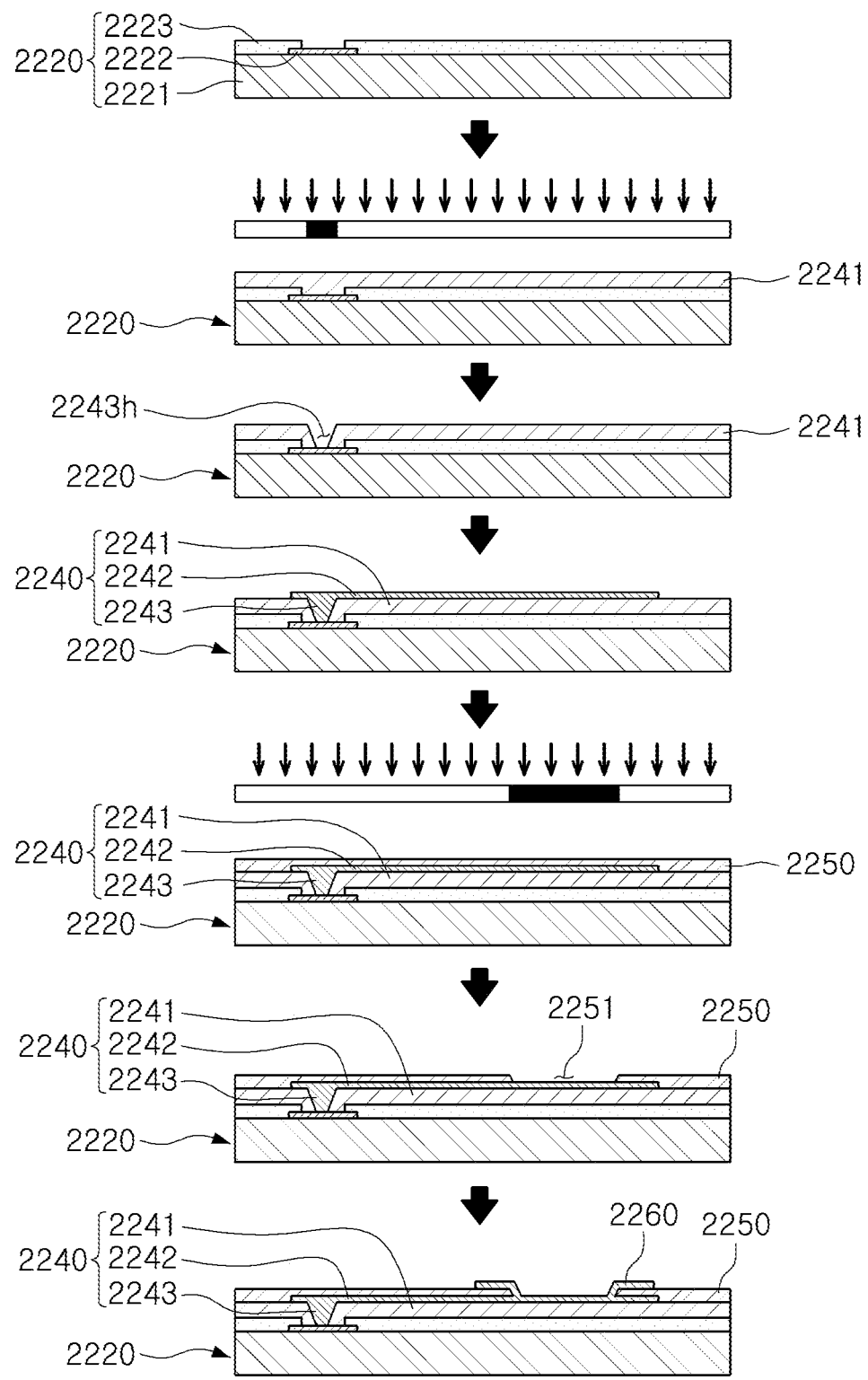
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate size level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
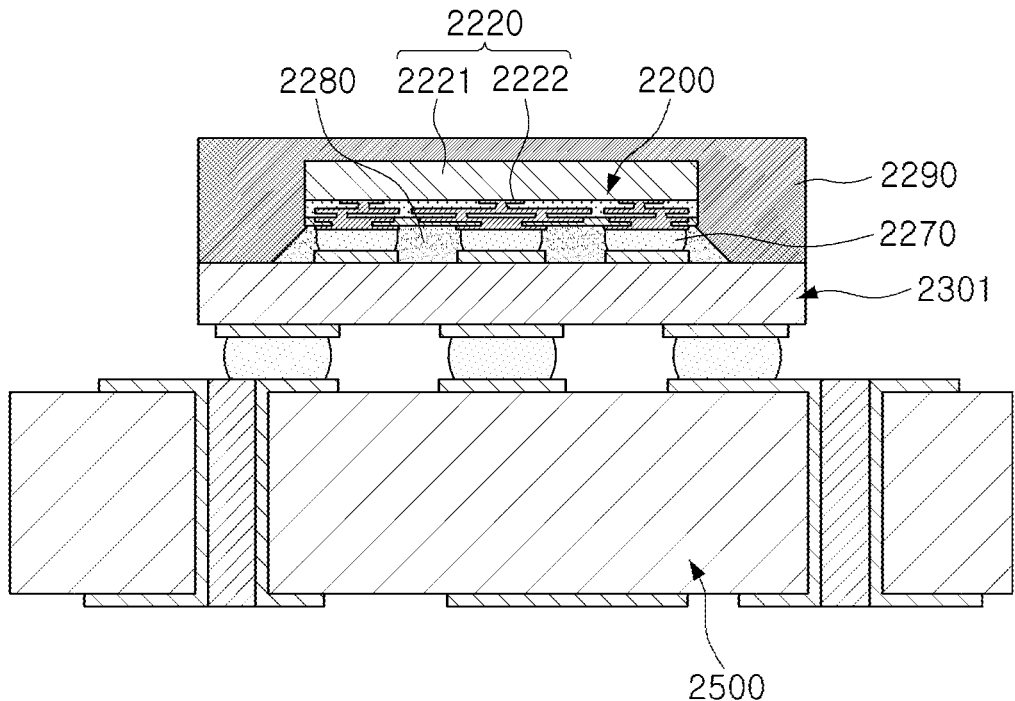
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
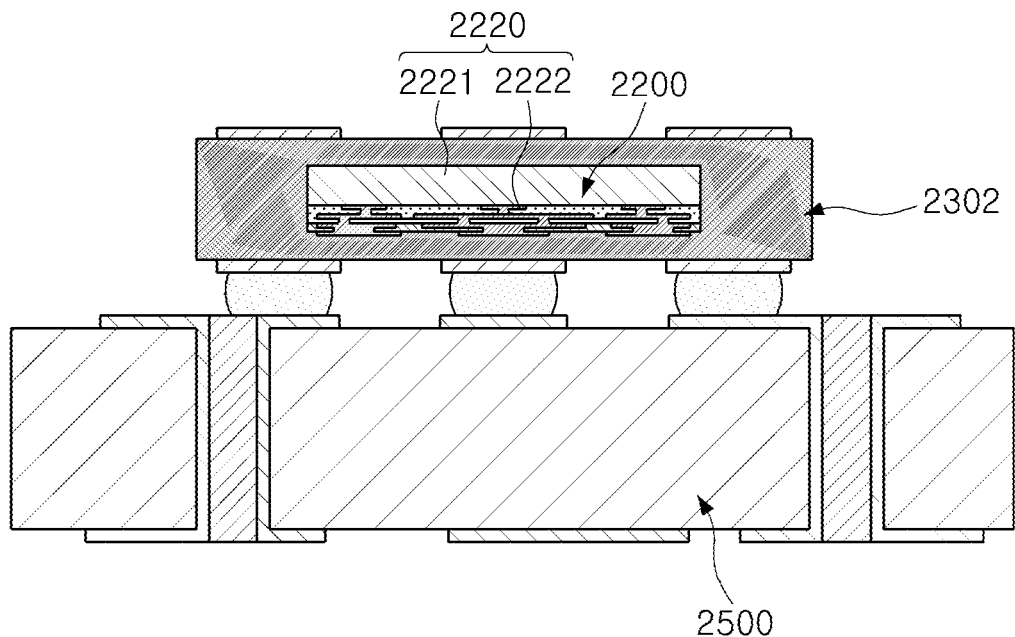
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, referring to FIG. 6, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
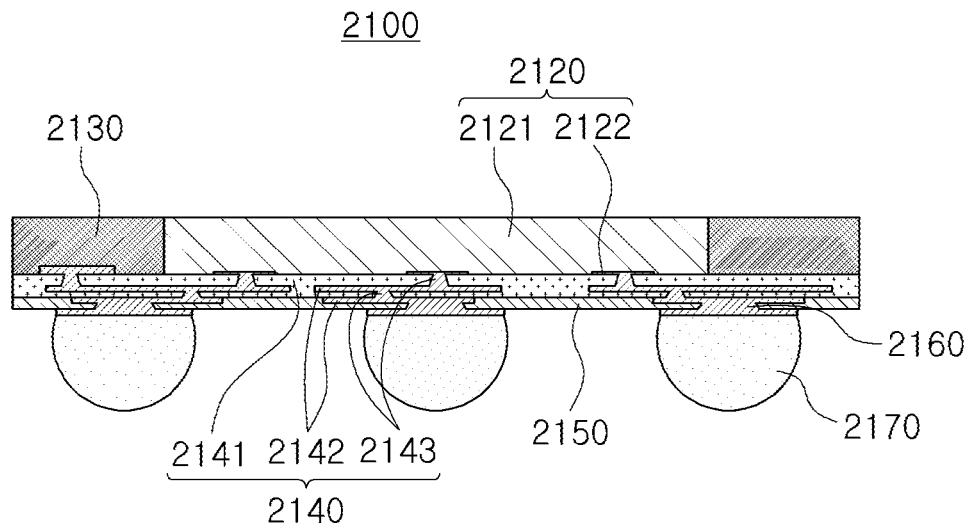
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
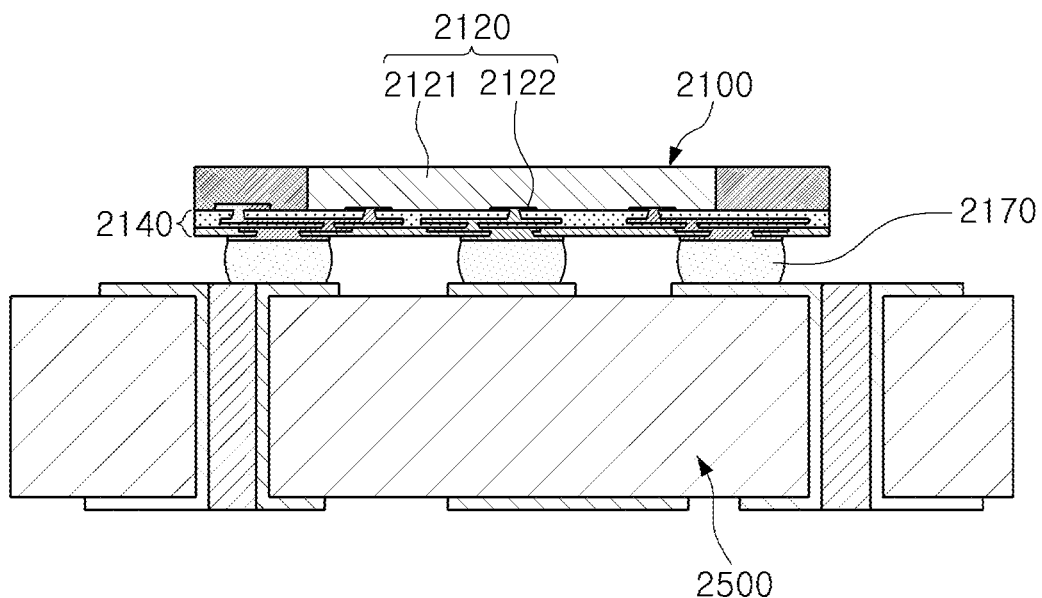
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Hereinafter, a fan-out semiconductor package, to which a backside circuit having a fine pitch may be applied in high yield, will be described with reference to accompanying drawings.

Figure 9:
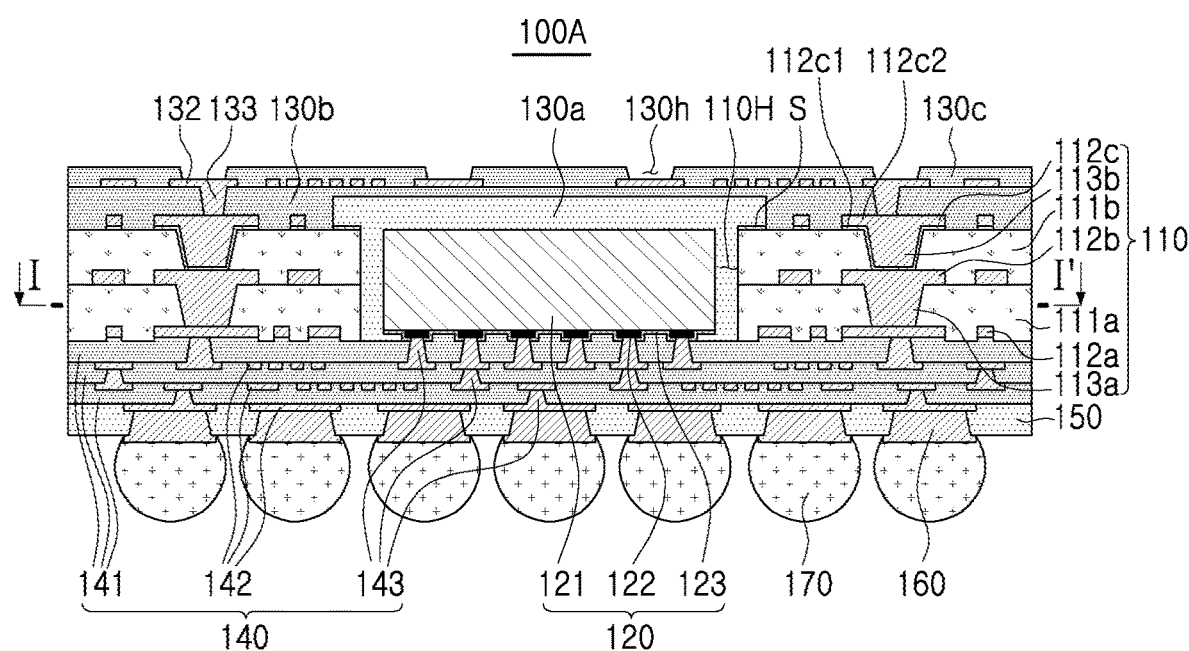
FIG. 9 is a schematic cross-sectional view illustrating an example of a fan-out semiconductor package.
Figure 10:
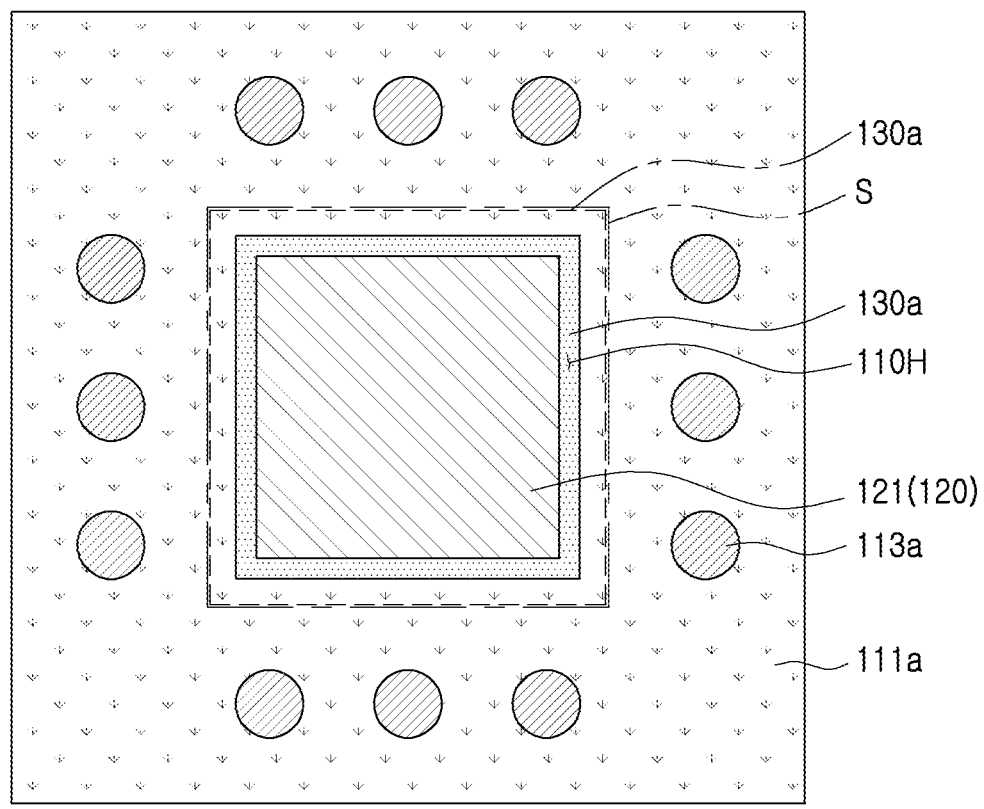
FIG. 10 is a cutaway plan view taken along line I-I' of the fan-out semiconductor package in FIG. 9.

FIG. 9 is a schematic cross-sectional view illustrating an example of a fan-out semiconductor package, and FIG. 10 is a cutaway plan view taken along line I-I' of the fan-out semiconductor package in FIG. 9.

Referring to FIGS. 9 and 10, a fan-out semiconductor package 100A according to an example embodiment may include a frame 110 having a penetration portion 110H, a semiconductor chip 120, disposed in the penetration portion 110H of the frame 110, having a connection pad 122, a connection structure 140 disposed on a lower side of the frame 110 and the semiconductor chip 120 and electrically connected to the connection pad 122, a first encapsulant 130a covering a back surface of the semiconductor chip 120 and a first region of a top surface of the frame 110 and extending between a sidewall of the penetration portion 110H and a side surface of the semiconductor chip 120, and a second encapsulant 130b covering a second region of the top surface of the frame 110 and being in contact with a side surface of a portion of the first encapsulant 130a covering the first region of the top surface of the frame 110. The first and second encapsulants 130a and 130b may include materials different from each other. The second encapsulant 130b may extend to cover the top surface of the first encapsulant 130a.

In the present disclosure, "materials different from each other" refers to "materials having different compositions and different physical properties." For example, the first encapsulant 130a may include a non-photoimageable dielectric, and the second encapsulant 130b may include a photoimageable dielectric. In the present disclosure, "cover" includes not only "directly cover to be in physical contact" but also "indirectly cover." For example, a metal layer S may be disposed between the first region of the top surface of the frame 110 and the first encapsulant 130a, as will be described later. In addition, in the present disclosure, "the top surface of the frame 110" refers to "a top surface of an uppermost insulating layer 111b among the insulating layers 111a and 111b constituting the frame 110," which will be similarly determined even when the frame 110 includes wiring layers 112a, 112b, and 112c.

As described above, recently, in order to achieve improved electrical characteristics and efficient space use of premium smartphones and to apply a package-on-package (PoP) of a semiconductor package including different semiconductor chips, a backside circuit is required to be formed in a semiconductor package structure. In addition, the requirement for a line and a space of a backside circuit has been increased to meet advance in chip characteristics and decrease in chip area. For example, a package-on-package structure, in which a memory package is laminated on an application processor package, has been required. To this end, introduction of a backside circuit to a fine design of an application processor has been required. Accordingly, a technique of forming a backside circuit by plating on a top surface of a molding material, encapsulating a semiconductor chip, has been proposed. However, since a typical molding material, encapsulating a semiconductor chip, includes a non-photoimageable dielectric, a photolithography method cannot be used. As a result, there is a limitation in fine pitch of a backside circuit.

Meanwhile, in the fan-out semiconductor package 100A according to an example embodiment, the back surface of the semiconductor chip 120 and the first region of the top surface of the frame 110 are covered with the first encapsulant 130a, including a non-photoimageable dielectric, at least a portion of the penetration portion 110H is filled with the first encapsulant 130a, and the second region of the top surface of the frame 110 is covered with the second encapsulant including a photoimageable dielectric. In this case, the semiconductor chip 120, the frame 110, and the penetration portion 110H may be encapsulated by the first encapsulant, a non-photoimageable dielectric layer, to significantly suppress void or undulation. The other portion of the frame 110, in which a via portion of the backside circuit is formed, may be encapsulated by the second encapsulant 130b to achieve fine pitch using a photolithography method.

In the case of the fan-out semiconductor package 100A according to an example embodiment, the frame 110 may include a plurality of wiring layers 112a, 112b, and 112c for providing a vertical electrical connection path and a plurality of wiring vias 113a and 113b electrically connecting the plurality of wiring layers 112a, 112b, and 112c. Among the plurality of wiring layers 112a, 112b, and 112c, an uppermost wiring layer 112c may be disposed on the second region of the top surface of the frame 110 to be covered with the second encapsulant 130b. A metal pattern layer 132 may be disposed on the second encapsulant 130b. The metal pattern layer 132 may be electrically connected to the uppermost wiring layer 112c through a metal via 133 penetrating through the second encapsulant 130b. The metal pattern layer 132 and the metal via 133 may constitute a backside circuit. The second encapsulant 130b may include a photoimageable dielectric, and a photolithography method may be used as a process of forming a via hole. Therefore, fine pitch of the metal pattern layer 132 and the metal via 133 may be implemented. A third encapsulant 130c may be disposed on the second encapsulant 130b to cover the metal pattern layer 132. The third encapsulant 130c has an opening 130h exposing at least a portion of the metal pattern layer 132. Since the third encapsulant 130c may also include a photoimageable dielectric, fine pitch of a multilayer backside circuit may be implemented, as necessary.

In the case of the fan-out semiconductor package 100A according to an example embodiment, a metal layer S may be disposed in the first region of the top surface of the frame 110 and may be covered with the first encapsulant 130a. As will be understood in a process to be described later, existence of the metal layer S may allow the first encapsulant 130a to more easily cover up to the first region of the frame 110. The first region of the top surface of the frame 110, for example, the metal layer S may be covered with the first encapsulant 130a, so that thickness uniformity of the first encapsulant 130a may be secured to address undulation, and adhesion of the first encapsulant 130a may be improved through an anchoring effect. When viewed from above, for example, when seeing through the metal layer S on the fan-out semiconductor package 100A in a plan view, the metal layer S may be continuously disposed to surround the penetration portion 110H. The uppermost wiring layer 112c may include a first conductor layer 112c1, formed as a seed layer by sputtering plating, or the like, simultaneously with formation of the metal layer S, a seed layer, and a second conductor layer 111c2, a plating layer, formed on the first conductor layer 112c1 by electrolytic plating, or the like. In this case, since the metal layer S and the first conductor layer 112c1 were the same layer, they may have substantially the same thickness and may include the same metal material. That is, the first conductor layer 112c1 disposed in the second region of the uppermost insulating layer may has a substantially the same level as the metal layer S. The second conductor layer 112c2, a plating layer, may have a thickness greater than a thickness of the first conductor layer 112c1, a seed layer. As a result, the uppermost wiring layer 112c may have a thickness greater than a thickness of the metal layer S. The term "substantially" refers to a concept including not only completely the same but also a fine error which is unavoidably caused by a process error or the like, and will be understood as "approximately."

Hereinafter, the components, included in the fan-out semiconductor packages 100A according to an example embodiment, will be described with reference to accompanying drawings.

The frame 110 may further improve rigidity of the fan-out semiconductor package 100A depending on a specific material of the insulating layers 111a and 111b, and may serve to secure thickness uniformity of the first encapsulant 130a, or the like. The frame 110 may have a penetration portion 110H penetrating through the insulating layers 111a and 111b. In the penetration portion 110H, the semiconductor chip 120 may disposed and, as necessary, a passive component, not illustrated, may also be disposed. The penetration portion 110H may have a wall surface surrounding the semiconductor chip 120, but a shape of the wall surface is not limited thereto. The frame 110 may include wiring layers 112a, 112b, and 112c and wiring vias 113a and 113b in addition to the insulating layers 111a and 111b, and thus, may serve as an electrical connection member providing a vertical electrical connection path. As necessary, another type of electrical connection member such as a metal post, providing a vertical electrical connection path, may be introduced into the frame 110.

In an example embodiment, the frame 110 includes a first insulating layer 111a disposed in contact with the connection structure 140, a first wiring layer 112a embedded in the first insulating layer 111a while being in contact with the connection structure 140, a second wiring layer 112b disposed on a side of the first insulating layer 111a opposing to a side in which the first wiring layer 112a is embedded, a second insulating layer 111b, disposed on the first insulating layer 111a, covering at least a portion of the second wiring layer 112b, and a third wiring layer 112c disposed on a side of the second insulating layer 111b opposing to a side in which the second wiring layer 112b is embedded. The first and second wiring layers 112a and 112b and the second and third wiring layers 112b and 112c may be electrically connected through the first and second wiring vias 113a and 113b penetrating through the first and second insulating layers 111a and 111b, respectively. The first to third wiring layers 112a, 112b, and 112c may be electrically connected to the connection pad 122 through the redistribution layer 142 and the connection via 143 of the connection structure 140 depending on functions thereof.

A material of the insulating layers 111a and 111b is not limited. For example, an insulating material may be used as a material of the insulating layers 111a and 111b. The insulating material may be a thermosetting resin such as an epoxy resin, a thermoplastic resin such as a polyimide resin, a resin in which the thermosetting resin or the thermoplastic resin is mixed with an inorganic filler, for example, Ajinomoto Build-up Film (ABF), or the like. Alternatively, the insulating material may be a material in which thermosetting resin or the thermoplastic resin is impregnated together with an inorganic filler in a core material such as a glass fiber (or a glass cloth or a glass fabric), for example, prepreg, or the like.

The wiring layers 112a, 112b, and 112c may provide a vertical electrical connection path of the fan-out semiconductor package 100A together with the wiring vias 113a and 113b, and may serve to redistribute the connection pad 122. A material of the wiring layers 112a, 112b, and 112c may be a metal such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on a design of a corresponding layer. For example, the wiring layers 112a, 112b, and 112c may include a ground (GND) pattern, a power (PWR) pattern, a signal (S') pattern, and the like. The signal (S') pattern includes various signal patterns, for example, a data signal pattern, and the like, except for the ground (GND) pattern, the power (PWR) pattern, and the like. The ground (GND) pattern and the power (PWR) pattern may be identical to each other. The wiring layers 112a, 112b, and 112c may include various types of via pad. The wiring layers 112a, 112b, and 112c may be formed by a known plating process, and may include a seed layer and a plating layer, respectively. For example, not only the third wiring layers 112c, the uppermost wiring layer 112c, but also the first and second wiring layers 112a and 112b may include a seed layer and a plating layer, respectively.

Each of the wiring layers 112a, 112b, and 112c may have a thickness greater than a thickness of the redistribution layer 142. More specifically, the frame 110 may have a thickness greater than or equal to a thickness of the semiconductor chip 120. Since prepreg, or the like, may be selected as a material of the insulating layers 111a and 111b to maintain rigidity of the insulating layers 111a and 111b, each of the wiring layers 112a, 112b, and 112c may also have a relatively great thickness. Meanwhile, since the connection structure 140 requires a fine circuit and a high-density design, and thus, a photoimageable dielectric (PID) or the like is selected as a material of the insulating layer 141, and the redistribution layer 142 may also have a relatively small thickness.

The first wiring layer 112a may be recessed into the first insulating layer 111a. The first wiring layer 112a is recessed into the first insulating layer 111a to form a step between a surface, disposed in contact with the connection structure 140 of the first insulating layer 111a, and a surface disposed in contact with the connection structure 140 of the first wiring layer 112a. In this case, when the semiconductor chip 120 and the frame 110 are encapsulated by the first encapsulant 130a, bleeding of the material of the first encapsulant 130a may be suppressed to prevent the first wiring layer 112a from being contaminated by the material of the first encapsulant 130a.

The wiring via 113a and 113b electrically connect the wiring layers 112a, 112b, and 112c, disposed on different layers, to form an electrical connection path in the frame 110. A material of the wiring vias 113a and 113b may be a metal material such as copper (Cu), aluminum (Al), silver (Ag), tin (Sn), gold (Au), nickel (Ni), lead (Pb), titanium (Ti), or alloys thereof. The wiring vias 113a and 113b may include a via for signals, a via for power, a via for grounding, or the like, and the via for power and the via for grounding may have structures identical to each other. Each of the wiring vias 113a and 113b may be a filled-type via filled with a metal material, or a conformal-type via in which a metal material is formed along a wall surface of a via hole. Moreover, each of the wiring vias 113a and 113b may have a tapered shape. The wiring vias 113a and 113b may also be formed by a plating process, and may include a seed layer and a plating layer. For example, the second wiring via 113b may also include a first conductor layer, formed as a seed layer, and a second conductor layer formed as a plating layer.

When a hole for the first wiring via 113a is formed, some pads of the first wiring layer 112a may serve as a stopper. Accordingly, it is advantageous in process that the first wiring via 113a has a tapered shape in which an upper side has a width greater than a width of a lower side. In this case, the first wiring via 113a may be integrated with a pad pattern of the second wiring layer 112b. Similarly, when a hole for the second wiring via 113b is formed, some pad of the second wiring layer 112b may serve as a stopper. Accordingly, it is advantageous in process that the second wiring via 113b has a tapered shape in which an upper side has a width greater than a width of a lower side. In this case, the second wiring via 113b may be integrated with a pad pattern of the third wiring layer 112c.

As will be understood in a process to be described later, the metal layer S may serve as a stopper while etching the first encapsulant 130a in such a manner that the first encapsulant 130a covers up to only the first region of the top surface of the frame 110. A side surface of the metal layer S may be exposed from the first encapsulant 130a and may be in contact with the second encapsulant 130b. The metal layer S may include a metal such as copper (Cu) and/or titanium (Ti). When viewed from above, for example, when seeing through the metal layer S on the fan-out semiconductor package 100A in a plan view, the metal layer S may be continuously disposed to surround the penetration portion 110H. The metal layer S may be made by the same process and the same material as the first conductor layer 112c1 of the third wiring layer 112c, the uppermost wiring layer 112c, and may only be isolated during an etching process.

As necessary, a metal layer, not illustrated, may be disposed on a wall surface of the penetration portion 110H of the frame 110 to shield electromagnetic interference or dissipate heat. The metal layer, not illustrated, may surround the semiconductor chip 120.

The semiconductor chip 120 may be an integrated circuit (IC) provided in an amount of several hundred to several million or more elements integrated in a single chip. The semiconductor chip 120 may be, for example, an application processor chip such as a central processor (for example, a central processing unit (CPU)), a graphics processor (for example, a graphics processing unit (GPU)), a digital signal processor, a cryptographic processor, a microprocessor, a microcontroller, or the like. However, the semiconductor chip 120 is not limited thereto, and may be a a power management integrated circuit (PMIC), a memory chip such as a volatile memory (for example, a DRAM), a nonvolatile memory (for example, a ROM), a flash memory, or the like, or a logic chip such as an analog-to-digital converter, an applications-specific integrated circuit (ASIC), or the like.

The semiconductor chip 120 may be an integrated circuit (IC) in a bare state in which an additional bump or wiring layer is not formed, but is not limited thereto. As necessary, the semiconductor chip 120 may be a packaged-type integrated circuit. The semiconductor chip 120 may be an IC formed based on an active wafer. In this case, a base material of a body 121 may be silicon (Si), germanium (Ge), gallium arsenide (GaAs), or the like. Various circuits may be formed on the body 121. The connection pad 122 may electrically connect the semiconductor chip 120 to other components. A material of the connection pad 122 may be a metal such as aluminum (Al) or the like, but is not limited thereto. A passivation layer 123 may be disposed on the body 121 to expose the connection pads 122, and may be an oxide layer, a nitride layer, or the like. Alternatively, the passivation layer 123 may be a double layer of an oxide layer and a nitride layer. The semiconductor chip has an active surface, on which the connection pad 122 is disposed, and an inactive surface, which is a back surface opposing the active surface. In some cases, a connection pad may also be disposed on a back surface, so that both surfaces may be active surfaces. As an example, when the passivation layer 123 is disposed on an active surface of the semiconductor chip 120, a positional relationship of the active surface of the semiconductor chip 120 is determined on the basis of a lowermost surface of the passivation layer 123.

The first encapsulant 130a encapsulates the semiconductor chip 120, covers the first region of the frame 110, and fills at least a portion of the penetration portion 110H. A thickness of a portion of the first encapsulant 130a covering the first region of the frame 110 may be greater than a thickness of the third wiring layer 112c, the uppermost wiring layer 112c. The first encapsulant 130a may include an insulating material. The insulating material may be a thermosetting resin such as an epoxy resin, a thermoplastic resin such as a polyimide resin, a resin having a reinforcing material, such as an inorganic filler impregnated in the thermosetting resin or the thermoplastic resin such as ABF. In addition, the known molding material such as an epoxy molding compound (EMC), or the like, may also be used. Alternatively, a material in which a thermosetting resin or a thermoplastic resin is impregnated with an inorganic filler and/or a core material such as a glass fiber may also be used as the insulating material. Accordingly, voids or undulation may be prevented, and warpage may be controlled more easily.

The second encapsulant 130b may encapsulate the second region of the frame 110, and may extend to a top surface of the first encapsulant 130a to cover the top surface of the first encapsulant 130a and a side surface thereof on the frame 110. The second encapsulant 130b may also include an insulating material such as a photoimageable dielectric (PID). The first encapsulant 130a may cover the metal layer S, and the second encapsulant 130b may cover the third wiring layer 112c, the uppermost wiring layer 112c. Futhermore, the second encapsulant 130b may also cover at least a portion of the second region of the frame and the wiring layer 112c. The third encapsulant 130c may be disposed on the second encapsulant 130b to cover a metal pattern layer 132 or the like and may have a plurality of openings exposing at least a portion of the metal pattern layer 132. An insulating material of the third encapsulant 130c may also be a PID. In this case, a fine pitch may be implemented even when a multilayer backside circuit is formed.

The metal pattern layer 132 is disposed on the second encapsulant 130b to provide a backside circuit to the fan-out semiconductor package 100A together with the metal via 133. The metal pattern layer 132 may also include a metal such as copper (Cu), aluminum (Al), silver (Ag), tin (Sn), gold (Au), nickel (Ni), lead (Pb), titanium (Ti), or alloys thereof. The metal pattern layer 132 may perform various functions depending on a design. For example, the metal pattern layer 132 may include a ground (GND) pattern, a power (PWR) pattern, a signal (S') pattern, and the like. The signal (S') pattern includes various signal patterns, for example, a data signal pattern, and the like, except for the ground (GND) pattern, the power (PWR) pattern, and the like. The ground (GND) pattern and the power (PWR) pattern may be identical to each other. The metal pattern layer 132 may be formed by a known plating process, and may include a seed layer and a conductor layer. The metal pattern layer 132 may be disposed on the second encapsulant 130b to implement a fine pitch.

The metal via 133 penetrates through the second encapsulant 130b, and electrically connects the metal pattern layer 132 to the third wiring layer 112c, the uppermost wiring layer 112c. The metal via 133 may also include a metal such as copper (Cu), aluminum (Al), silver (Ag), tin (Sn), gold (Au), nickel (Ni), lead (Pb), titanium (Ti), or alloys thereof. The metal via 133 may be a filled-type via filled with a metal material, or a conformal-type via in which a metal material is formed along a wall surface of a via hole. The metal via 133 may have a tapered shape of the same direction as the wiring vias 113a and 113b. The metal via 133 may also include a via for signals, a via for power, a via for grounding, or the like, and the via for power and the via for grounding may be identical to each other. The metal via 143 may also be formed by a known plating process, and may include a seed layer and a plating layer. The metal via 133 may be formed by filling a via hole, formed in the second encapsulant 130b by a photolithography method, with plating. As a result, a fine pitch may be implemented through a photo via.

The connection structure 140 may redistribute the connection pad 122 of the semiconductor chip 120. Several tens to several hundreds of connection pads 122, having various functions, may be redistributed through the connection structure 140 and may be physically and/or electrically connected to outside through the electrical connection metal 170 depending on the functions thereof. The connection structure 140 includes an insulating layer 141, a redistribution layer 142, disposed on the insulating layer 141, and a connection via 143 penetrating through the insulating layer 141 and electrically connecting the connection pad 122 and the redistribution layer 142 to each other and electrically connecting the first wiring layer 112a, which is the lowermost wiring layer 112a among the wiring layers 112a, 112b, and 112c, and the redistribution layer 142 to each other. The insulating layer 141, the redistribution layer 142, and the connection vias 143 may include a larger number of layers than those illustrated in the drawings, or a smaller number of layers than those illustrated in the drawings.

A material of the insulating layer 141 may be an insulating material such as a photoimageable dielectric (PID). In this case, a fine pitch may be introduced through a photo via, which is advantageous in fine circuit and high-density design and allows several tens to several millions of connection pads 122 of the semiconductor chip 120 to be effectively redistributed. Boundaries between the insulating layers 141 may be apparent or may not be readily apparent.

The redistribution layer 142 may redistribute the connection pad 122 of the semiconductor chip 120 to electrically connect the connection pad 122 to the electrical connection metal 170. A material of the redistribution layer 142 may also be a metal such as copper (Cu), aluminum (Al), silver (Ag), tin (Sn), gold (Au), nickel (Ni), lead (Pb), titanium (Ti), or alloys thereof. The redistribution layer 142 may also perform various functions depending on a design. For example, the redistribution layer 142 may include a ground (GND) pattern, a power (PWR) pattern, a signal (S') pattern, and the like. The ground (GND) pattern and the power (PWR) pattern may be identical to each other. The redistribution layer 142 may include various types of via pad, electrical connection metal pad, and the like. The redistribution layer 142 may be formed by a plating process, and may include a seed layer and a conductor layer.

The connection via 143 electrically connects redistribution layers 142, disposed on different layers, to each other and electrically connects the connection pad 122 of the semiconductor chip 120 and the first wiring layer 112a, the lowermost wiring layer 112a, of the frame 110 to the redistribution layer 142. The connection via 143 may be in physical contact with the connection pad 122 when the semiconductor chip 120 is a bare die. A material of the connection via 143 may also be a metal such as copper (Cu), aluminum (Al), silver (Ag), tin (Sn), gold (Au), nickel (Ni), lead (Pb), titanium (Ti), or alloys thereof. The connection via 143 may include a via for signals, a via for power, a via for grounding, or the like, and the via for power and the via for grounding may be identical to each other. The connection via 143 may also be a filled-type via filled with a metal material, or a conformal-type via in which a metal material is formed along a wall surface of a via hole. Moreover, the connection via 143 may have a tapered shape of a direction opposite to a direction of the wiring vias 113a and 113b. The connection via 143 may also be formed by a plating process, and may include a seed layer and a conductor layer.

The passivation layer 150 may be additionally configured to protect the connection structure 140 from external physical and chemical damage and the like. The passivation layer 150 may include a thermosetting resin. For example, the passivation layer 150 may be ABF, but is not limited thereto. The passivation layer 150 has an opening exposing at least a portion of the lowermost redistribution layer 142 of the redistribution layer 142. There may be several tens to several tens of thousands of openings, and the passivation layer 150 may be provided with a larger or smaller number of openings. Each of the openings may include a plurality of holes. As necessary, a surface-mount component such as a capacitor may be disposed on a bottom surface of the passivation layer 150 to electrically connect the passivation layer 150 to the redistribution layer 142. As a result, the passivation layer 150 may be electrically connected to the semiconductor chip 120.

The underbump metal 160 may also be additionally configured to improve connection reliability of the electrical connection metal 170 and to improve board level reliability of the fan-out semiconductor package 100A according to an example embodiment. There may be several tens to several millions of underbump metals 160, and a larger or smaller number of underbump metals 160 may be provided. Each underbump metal 160 may be disposed in the opening of the passivation layer 150 to be electrically connected to the exposed lowermost redistribution layer 142. The underbump metal 160 may be formed by a known metallization method using a metal, but is not limited thereto.

The electrical connection metal 170 is also additionally configured to physically and/or electrically connect the fan-out semiconductor package 100A to an external component. For example, the fan-out semiconductor package 100A may be mounted on a mainboard of an electronic device through the electrical connection metal 170. The electrical connection metal 170 may be disposed on the passivation layer 150 and may be electrically connected to the underbump metal 160. Each electrical connection metal 170 may include a low melting point metal such as tin (Sn) or a Sn-containing alloy. More specifically, each electrical connection metal 170 may be formed of a solder or the like, but is merely an example and a material thereof is not limited thereto.

The electrical connection metal 170 may be a land, a solder ball, a pin, or the like. The electrical connection metal 170 may be formed as a multilayer structure or a single-layer structure. When the electrical connection metal 170 is formed as a multilayer structure, the electrical connection metal 170 may include a copper (Cu) pillar and a solder. When the electrical connection metal 170 is formed as a single-layer structure, the electrical connection metal 170 may include a tin-silver solder or copper (Cu). However, these are also merely examples, and a structure and a material of the electrical connection metal 170 are not limited thereto. The number, an interval, a dispositional form, and the like, of the electrical connection metal 170 are not limited, but may be sufficiently modified depending on design by those skilled in the art. For example, several tens to several tens of thousands of electrical connection metals 170 may be provided according to the number of connection pads 122, and a greater or smaller number of electrical connection metals 170 may be provided.

At least one of the electrical connection metals 170 is disposed in a fan-out region. The term "fan-out region" refers to a region except for a region in which the semiconductor chip 120 is disposed. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

Figure 11:
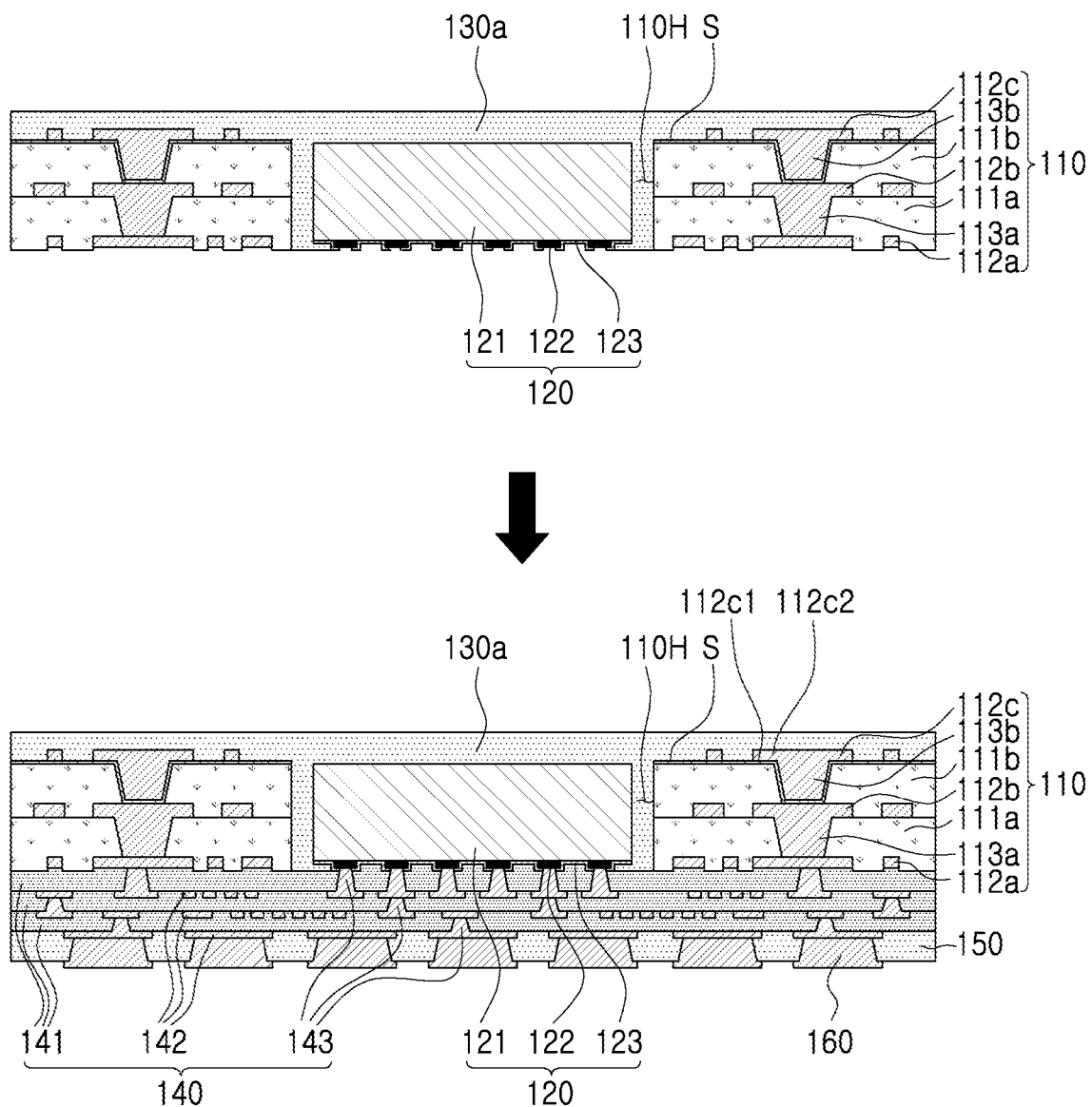
FIGS. 11 and 12 are process diagrams illustrating an example of manufacturing the fan-out semiconductor package in FIG. 9.
Figure 12:
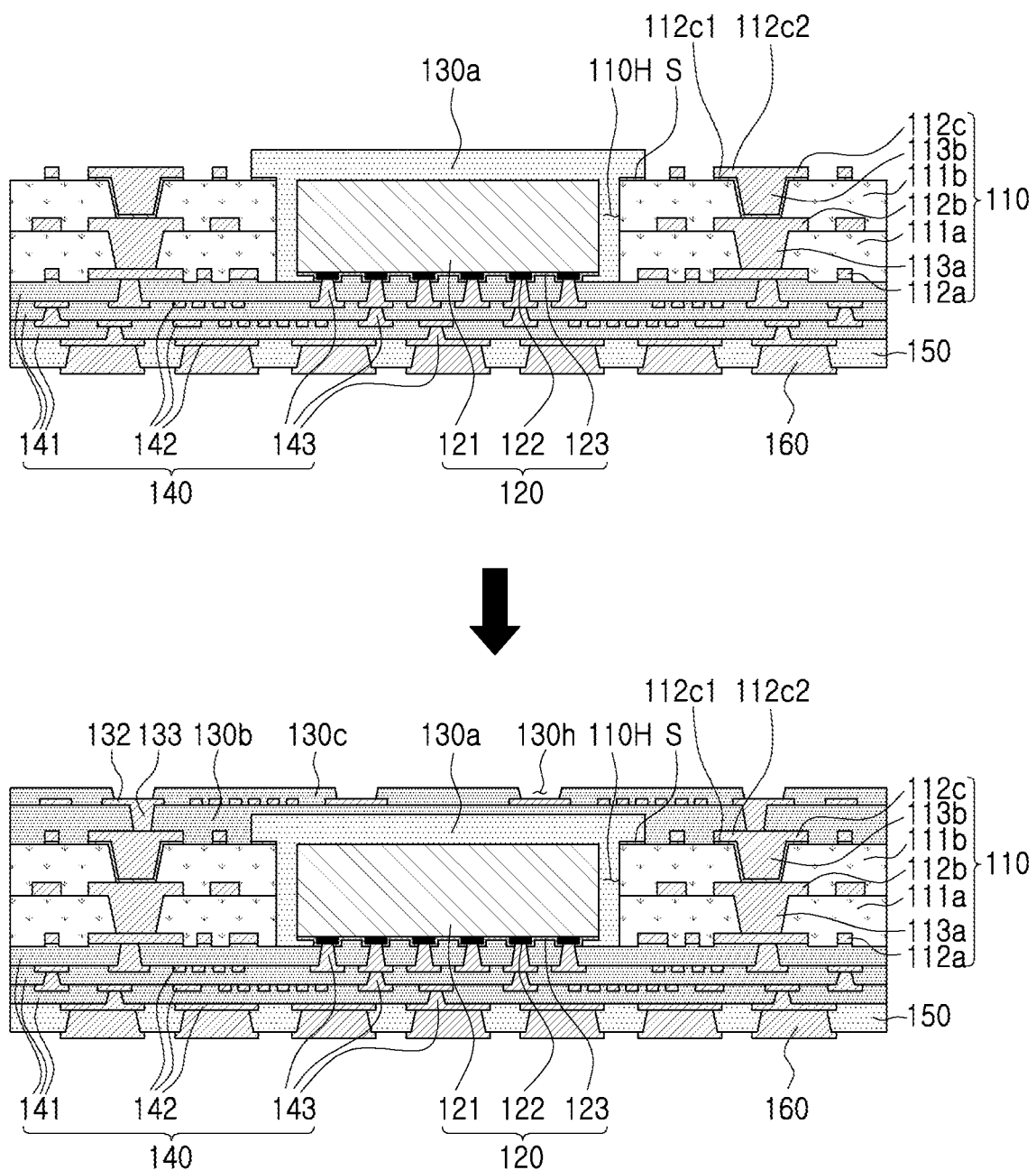

FIGS. 11 and 12 are process diagrams illustrating an example of manufacturing the fan-out semiconductor package in FIG. 9.

Referring to FIG. 11, a frame 110 is prepared. A metal layer S, used as a seed layer of electrolytic plating for forming a third wiring layer 112c and a second wiring via 113b, remains on a top surface of the frame 110 without being removed by etching. A penetration portion 110H is formed in the frame 110 by laser drilling or the like. After the frame 110 is attached to a tape, not illustrated, or the like, a semiconductor chip 120 is disposed on the tape, not illustrated, exposed to the penetration portion 110H, in a face-down form. A first encapsulant 130a is formed by a method such as lamination and curing of ABF, or the like, to encapsulate the frame 110 and the semiconductor chip 120. A thickness of a portion of the first encapsulant 130a covering the frame 110 may be greater than a thickness of the third wiring layer 112c, such that the third wiring layer 112c is covered and protected by the first encapsulant 130a in subsequent processes to form a connection structure 140. After removing the tape, not illustrated, or the like, an insulating layer 141 is formed on the frame 110 and an active surface of the semiconductor chip 120 by applying and curing PID or the like, a photo via hole is formed, a redistribution layer 142 and a connection via 143 are formed using a plating process such as an additive process (AP), a semi-AP (SAP), a modified SAP (MSAP), tenting, or the like, and, as necessary, these steps are repeatedly performed to form the connection structure 140. In addition, a passivation layer 150 and an underbump metal 160 are formed, as necessary.

Referring to FIG. 12, a portion, covering a second region of a top surface of the frame 110 of the first encapsulant 130a, is removed by laser ablation using the metal layer S as a stopper. The metal layer S of an unnecessary portion is electively removed by flash etching or the like. After a PID is applied and cured in such a manner that a second encapsulant 130b is formed to cover the first encapsulant 130a and the second region of the top surface of the frame 110, a metal pattern layer 132 and a metal via 133 are formed by the above-mentioned plating process. As necessary, a third encapsulant 130c is further formed by applying and curing the PID, and an opening 130h or the like is formed by a photolithography method. As necessary, an electrical connection metal 170 is formed, thereby the above-described fan-out semiconductor package according to an example embodiment is manufactured.

Figure 13:
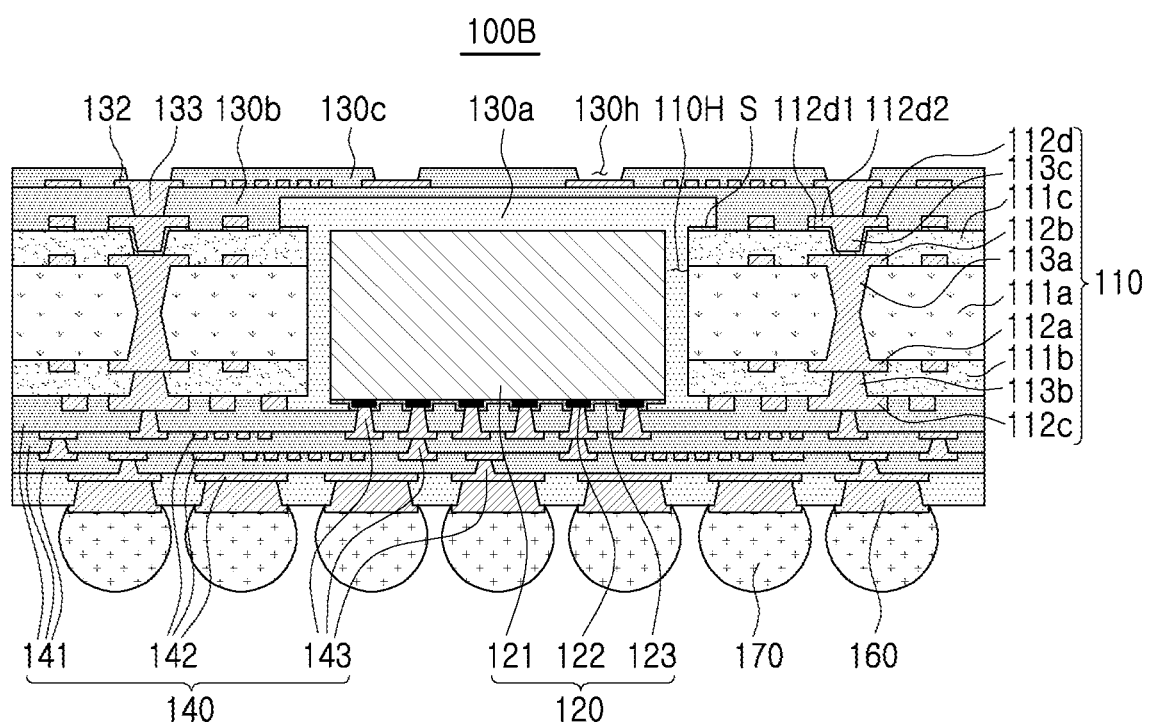
FIG. 13 illustrates another example of a fan-out semiconductor package.

FIG. 13 illustrates another example of a fan-out semiconductor package.

Referring to FIG. 13, a fan-out semiconductor package 100B according to another example embodiment includes a frame 110 having a structure different from a structure of the frame 110 of the above-described fan-out semiconductor package 100A according to an example embodiment. More specifically, the frame 110 may include a first insulating layer 111a, a first wiring layer 112a and a second wiring layer 112b respectively disposed on both surfaces of the first insulating layer 111a, a second insulating layer 111b and a third insulating layer 111c, respectively disposed on both surfaces of the first insulating layer 111a, and respectively covering the first wiring layers 112a and the second wiring layer 112b, a third wiring layer 112c disposed on a side of the second insulating layer 111b opposing to a side in which the first wiring layer 112a is embedded, a fourth wiring layer 112d disposed on a side of the third insulating layer 111c opposing to a side in which the second wiring layer 112b is embedded, a first wiring via 113a penetrating through the first insulating layer 111a and electrically connecting the first and second wiring layers 112a and 112b to each other, a second wiring via 113b penetrating through the second insulating layer 111b and electrically connecting the first and third wiring layers 112a and 112c to each other, and a third wiring via 113c penetrating through the third insulating layer 111c and electrically connecting the second and fourth wiring layers 112b and 112d to each other. Since the frame 110 includes a greater number of wiring layers 112a, 112b, 112c, and 112d, the connection structure 140 may be further simplified.

The first insulating layer 111a may have a thickness greater than a thickness of the second insulating layer 111b and a thickness of the third insulating layer 111c. The first insulating layer 111a may have a relatively great thickness to maintain rigidity, and the second and third insulating layers 111b and 111c may be introduced to form a greater number of wiring layers 112c and 112d. From a similar point of view, the first wiring via 113a penetrating through the first insulating layer 111a may have an average diameter and a height greater than an average diameter and a height of each of the second and third wiring vias 113b and 113c penetrating through the second and third insulating layers 111b and 111c. The first wiring via 113a may have an hourglass shape or a cylindrical shape, and the second and third wiring vias 113b and 113c may have tapered shapes of opposite directions. Each of the wiring layers 112a, 112b, 112c, and 112d may have a thickness greater than a thickness of the redistribution layer 142.

In the fan-out semiconductor package 100B according to another example embodiment, the first encapsulant 130a may cover up to a first region of a top surface of the frame 110, and the second encapsulant 130b may cover a second region of the top surface of the frame 110 and extend to cover a top surface of the first encapsulant 130a. A thickness of a portion of the first encapsulant 130a covering the first region of the frame 110 may be greater than a thickness of the fourth wiring layer 112d, an uppermost wiring layer 112d. A metal layer S may be disposed in the first region of the top surface of the frame 110, such that the first encapsulant 130a to cover the metal layer S. The fourth wiring layer 112d, an uppermost wiring layer 112d, may be disposed in the second region of the top surface of the frame 110, such that the second encapsulant 130b may cover the fourth wiring layer 112d. The metal layer S may have the same configuration as a first conductor layer 112d1, a seed layer of the fourth wiring layer 112d. That is, the first conductor layer 112d1 may be disposed in the second region of the uppermost insulating layer 111c at substantially the same level as the metal layer S. Therefore, the metal layer S may have substantially the same thickness as the first conductor layer 112d1, and the metal layer S and the first conductor layer 112d1 may include the samemetalmaterial. The second conductor layer 112d2 is formed by electrolytic plating using the first conductor layer 112d1 as a seed layer, and may have a thickness greater than a thickness of the first conductor layer 112d1. As a result, the fourth wiring layer 112d may have a thickness greater than the metal layer S.

The other descriptions are substantially the same as the detailed description of the fan-out semiconductor package 100A according to an example embodiment, and will be omitted herein.

As described above, a fan-out package structure, to which a backside circuit having a fine pitch may be applied in high yield, may be provided.

In the present disclosure, the terms "lower side," "lower portion", "lower surface," and the like, have been used to indicate a direction a mounted surface of the fan-out semiconductor package oriented in relation to cross sections of the drawings, the terms "upper side," "upper portion," "upper surface," and the like, have been used to indicate an opposite direction to the direction indicated by the terms "lower side," "lower portion," "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second," the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A fan-out semiconductor package comprising:
   a connection structure, having an upper surface, and including a first redistribution layer below the upper surface;
   a semiconductor chip, disposed on the upper surface of the connection structure, and having a front surface on which a connection pad is disposed, a back surface opposite to the front surface, and side surfaces between the front surface and the back surface, the connection pad electrically connected to the first redistribution layer;
   a conductor structure, spaced apart from the side surfaces of the semiconductor chip on the upper surface of the connection structure, and configured to provide an electrical connection path in a direction perpendicular to the upper surface of the connection structure;
   a first encapsulant, covering the back surface of the semiconductor chip, and extending between the conductor structure and the side surfaces of the semiconductor chip;
   a second encapsulant, covering a top surface of the conductor structure, and being in contact with at least a portion of side surfaces of the first encapsulant; and
   a second redistribution layer, disposed on the second encapsulant, and electrically connected to the first redistribution layer through the conductor structure.

2. The fan-out semiconductor package of claim 1, wherein the second encapsulant extends to cover a top surface of the first encapsulant.

3. The fan-out semiconductor package of claim 1, wherein the second redistribution layer is spaced apart from the first encapsulant by the second encapsulant.

4. The fan-out semiconductor package of claim 1, wherein a bottom surface of the second redistribution layer directly contacts a top surface of the second encapsulant.

5. The fan-out semiconductor package of claim 1, further comprising:
a metal via penetrating through the second encapsulant and electrically connect the second redistribution layer to the conductor structure.

6. The fan-out semiconductor package of claim 1, further comprising:
a third encapsulant, disposed on the second encapsulant, covering the second redistribution layer, and having an opening exposing at least a portion of the second redistribution layer.

7. The fan-out semiconductor package of claim 1, wherein the first and second encapsulants include different materials to each other.

8. The fan-out semiconductor package of claim 7, wherein the first encapsulant includes a non-photoimageable dielectric, and
the second encapsulant includes a photoimageable dielectric.

9. The fan-out semiconductor package of claim 1, wherein the top surface of the conductor structure is at a higher level than the back surface of the semiconductor chip.

10. The fan-out semiconductor package of claim 1, wherein a top surface of the first encapsulant is at a higher level than the top surface of the conductor structure.

11. The fan-out semiconductor package of claim 1, wherein a top surface of the second encapsulant is at a higher level than a top surface of the first encapsulant.

12. The fan-out semiconductor package of claim 1, wherein side surfaces of the conductor structure is spaced apart from the first encapsulant.

13. The fan-out semiconductor package of claim 1, further comprising:
An electrical connection metal, disposed below the connection structure, and electrically connected to the first redistribution layer.

14. A fan-out semiconductor package comprising:
a connection structure, having an upper surface, and including a first redistribution layer below the upper surface;
a semiconductor chip, disposed on the upper surface of the connection structure, and having a front surface on which a connection pad is disposed, a back surface opposite to the front surface, and side surfaces between the front surface and the back surface, the connection pad electrically connected to the first redistribution layer;
a first encapsulant, surrounding the back surface of the semiconductor chip and the side surfaces of the semiconductor chip, and having a top surface, spaced apart from the back surface of the semiconductor chip, and side surfaces extending from the top surface of the first encapsulant to the upper surface of the connection structure;
a second encapsulant, surrounding the top surface of the first encapsulant and the side surfaces of the first encapsulant, and having a top surface spaced apart from the top surface of the first encapsulant; and
a second redistribution layer, disposed on the top surface of the second encapsulant, and electrically connected to the first redistribution layer through an electrical connection path penetrating through the second encapsulant.

15. The fan-out semiconductor package of claim 14, further comprising:
a conductor structure, disposed between the first and second redistribution layers, and connected to the first and second redistribution layers.

16. The fan-out semiconductor package of claim 15, wherein the conductor structure has a top surface, and side surfaces extending from the top surface of the conductor structure toward the upper surface of the connection structure, and
the second encapsulant surrounds the top surface of the conductor structure and the side surfaces of the conductor structure.

17. The fan-out semiconductor package of claim 14, wherein the first encapsulant includes a non-photoimageable dielectric, and
the second encapsulant includes a photoimageable dielectric.

18. A fan-out semiconductor package comprising:
a connection structure, having an upper surface, and including a first redistribution layer below the upper surface;
a semiconductor chip, disposed on the upper surface of the connection structure, and having a front surface on which a connection pad is disposed, a back surface opposite to the front surface, and side surfaces between the front surface and the back surface, the connection pad electrically connected to the first redistribution layer;
a first encapsulant, surrounding the side surfaces of the semiconductor chip, and having side surfaces spaced apart from the side surfaces of the semiconductor chip;
a second encapsulant, surrounding the side surfaces of the first encapsulant, and covering the back surface of the semiconductor chip; and
a conductor structure, extending in a direction perpendicular to the upper surface of the connection structure within the second encapsulant, and electrically connected to the first redistribution layer.

19. The fan-out semiconductor package of claim 18, further comprising:
a second redistribution layer, disposed on the second encapsulant, and electrically connected to the conductor structure.

20. The fan-out semiconductor package of claim 18, wherein the first encapsulant includes a non-photoimageable dielectric, and
the second encapsulant includes a photoimageable dielectric.

* * * * *